United States Patent [19]
Okada

[11] Patent Number: 6,054,381
[45] Date of Patent: Apr. 25, 2000

[54] SEMICONDUCTOR DEVICE, AND METHOD OF MANUFACTURING SAME

[75] Inventor: Norio Okada, Tokyo, Japan

[73] Assignee: NEC Corporation, Tokyo, Japan

[21] Appl. No.: 09/100,962

[22] Filed: Jun. 22, 1998

[30] Foreign Application Priority Data

Jun. 20, 1997 [JP] Japan ................................. 9-164467

[51] Int. Cl.⁷ ............................................. H01L 21/441
[52] U.S. Cl. ..................... 438/624; 438/421; 438/422; 438/619
[58] Field of Search .................................. 438/597, 619, 438/778, 782, 624, 421, 422

[56] References Cited

U.S. PATENT DOCUMENTS

| 5,468,685 | 11/1995 | Orisaka et al. |
| 5,728,631 | 3/1998 | Wang ...................................... 438/787 |
| 5,783,481 | 7/1998 | Brennan et al. .......................... 438/623 |
| 5,837,618 | 11/1998 | Avanzino et al. ....................... 438/778 |

FOREIGN PATENT DOCUMENTS

| 63-98134 | 4/1988 | Japan . |
| 63-318752 | 12/1988 | Japan . |
| 5-283542 | 10/1993 | Japan . |
| 7-114236 | 12/1995 | Japan . |
| 8-125020 | 5/1996 | Japan . |
| 9-64172 | 3/1997 | Japan . |

*Primary Examiner*—C. Everhart
*Attorney, Agent, or Firm*—Foley & Lardner

[57] ABSTRACT

The present invention is a semiconductor device having a plurality of wiring on a semiconductor substrate. It is provided with a first insulating film which covers the surface of all the aforesaid wiring, and a second insulating film containing air gaps which is formed between such of the aforesaid wiring as is mutually adjacent.

The method of manufacturing the semiconductor device to which the present invention pertains comprises a process whereby the first insulating film is formed in such a manner as to cover the surface of the plurality of wiring formed on the semiconductor substrate, and a process whereby the second insulating film containing air gaps is formed between such of the wiring on the aforesaid substrate as is mutually adjacent. Here, the first insulating film is formed by means of the plasma CVD or spin coating methods, the second by means of the plasma CVD, spin coating, bias CVD, sputtering or similar methods.

10 Claims, 7 Drawing Sheets

SEMICONDUCTOR DEVICE, AND METHOD OF MANUFACTURING SAME

BACKGROUND OF THE INVENTION

1. Field of the Invention

The present invention relates to a semiconductor device and method of manufacturing the same, and in particular to a semiconductor device and method of manufacturing the same wherein it is possible to inhibit increases in interwiring capacitance in a highly integrated semiconductor device.

2. Description of the Related Art

Advances in semiconductor devices whereby the wiring has become progressively finer have created problems of increased interwiring capacitance. This results in reduced performance of the semiconductor device. Smaller intervals between wiring in the same wiring layer means that lowering the permittivity of the insulating film which is formed between the wiring fails to inhibit increased interwiring capacitance there.

With a view to inhibiting such increases in interwiring capacitance, Japanese Patent publication H7[1995]-114236 proposes a technique whereby air gaps are formed between the wiring in order to improve insulation properties. More specifically, as FIG. 6(a) shows, wiring 16 is formed on a semiconductor substrate 14 with the aid of an insulating film 15. Then, as may be seen from FIG. 6(b), the sputtering method is employed to embed an insulating film 18 between the wiring 16. Simultaneously, air gaps 17 are formed to correspond to the aspect ratio of the embedded section (ratio of the interval between the wiring 16 and its height).

However, the formation of air gaps 17 by the sputtering method and otherwise in the above mentioned conventional example is fraught with problems. That is to say, the insulating film which is formed on the side walls of the wiring 16 is less dense than that which is formed on other parts. This is because with the sputtering method there is directionality in the movement of particles as they are deposited on the substrate, and they are not easily deposited on the side walls of the wiring 16. This leads to problems of reliability, and of reduced ability to withstand voltage in particular. What is more, mask slipping means that the via (or through-hole) which serves to connect layers in the wiring 16 is not formed in its correct position, and this can cause shorting to occur between the wiring 16.

There follows, with reference to FIG. 7, a detailed explanation of the disadvantages of forming an insulating film 18 containing air gaps between the wiring 16 as described in relation to the conventional technology.

As FIG. 7(a) shows, in the conventional technology the sputtering method or bias CVD method are used to form an insulating film 18 containing air gaps 17 between the wiring 16, after which CMP (chemical mechanical polishing or a similar method is employed to flatten it. There is an inherent problem in that if the distance between adjacent wiring 16 is only a few mm or less, the insulating film formed on the respective side walls of adjacent wiring 16 will be less dense than that which is formed in places where the distance between the wiring 16 is measured in the tens of mm or above.

As may be seen from FIG. 7(b), a lithography process is used to form a via 20 which serves to perform the upper-layer wiring and interlayer connection. Here, it is impossible to ensure a satisfactory degree of accuracy in mask matching when using lithography techniques to form the lower-layer wiring 16 and the via 20. This leads to problems of shorting when the via 20 is not formed in the correct position on the wiring 16.

Where, as FIG. 7(c) shows, the CVD method is employed to form the via 20 and tungsten or other metals (compounds) are embedded, CVD gas (e.g. $WF_6$) finds its way into a low-density insulating film 19 formed on the inner walls of the air gaps and the side walls of the wiring, resulting in the formation of inadequate insulating films 19a, 19b. These inadequate insulating films 19a, 19b are the cause of shorting. In addition to this, etching fluid and various types of gas (air etc.) find their way into the air gaps during formation of the via. This results in a lowering of the density during embedding of the via by the CVD method, and is problematic because it leads to the creation of cavities 21 in the via as well as inadequate connection.

SUMMARY OF THE INVENTION

It is an object of the present invention to provide a semiconductor device having an insulating film containing air gaps, with improved reliability of the wiring and the via. It is a further object to provide a method of manufacturing the same.

With a view to attaining the above mentioned object, the semiconductor device to which the present invention pertains is characterised in that it has a plurality of wiring on a semiconductor substrate, being provided with a first insulating film which covers the surface of all the said wiring; and a second insulating film which contains air gaps formed between adjacent wiring.

Meanwhile, the method of manufacturing a semiconductor device to which the present invention pertains comprises the processes of forming the wiring, forming a first insulating film, and forming a second insulating film. More precisely, the processes of forming the wiring, first and second insulating films involve treatments whereby respectively wiring is formed on the semiconductor substrate, the first insulating film is formed on the surface of the wiring, and the second insulating film containing air gaps is formed between the wiring which is covered by the first insulating film.

The first insulating film is formed by means of the plasma CVD or spin coating methods. The plasma CVD method is preferable to the sputtering or bias CVD methods in that it gives lower directionality when the particles are deposited on the semiconductor substrate, while also ensuring adequate density on the side walls of the wiring. The same is true of the spin coating method. The second insulating film is formed by means of the bias CVD, plasma CVD, sputtering or spin coating methods.

BRIEF DESCRIPTION OF THE DRAWINGS

FIGS. 1(a) and 1(b) show cross-sectional views illustrating the semiconductor device to which an embodiment of the present invention pertains, FIG. 1(a) showing the formation of the wiring and insulating film, while FIG. 1(b) shows the formation of the via;

DESCRIPTION OF THE PREFERRED EMBODIMENTS

There follows, with reference to the drawings, a description of the preferred embodiments of the present invention.

Embodiment 1

Figure 1A:
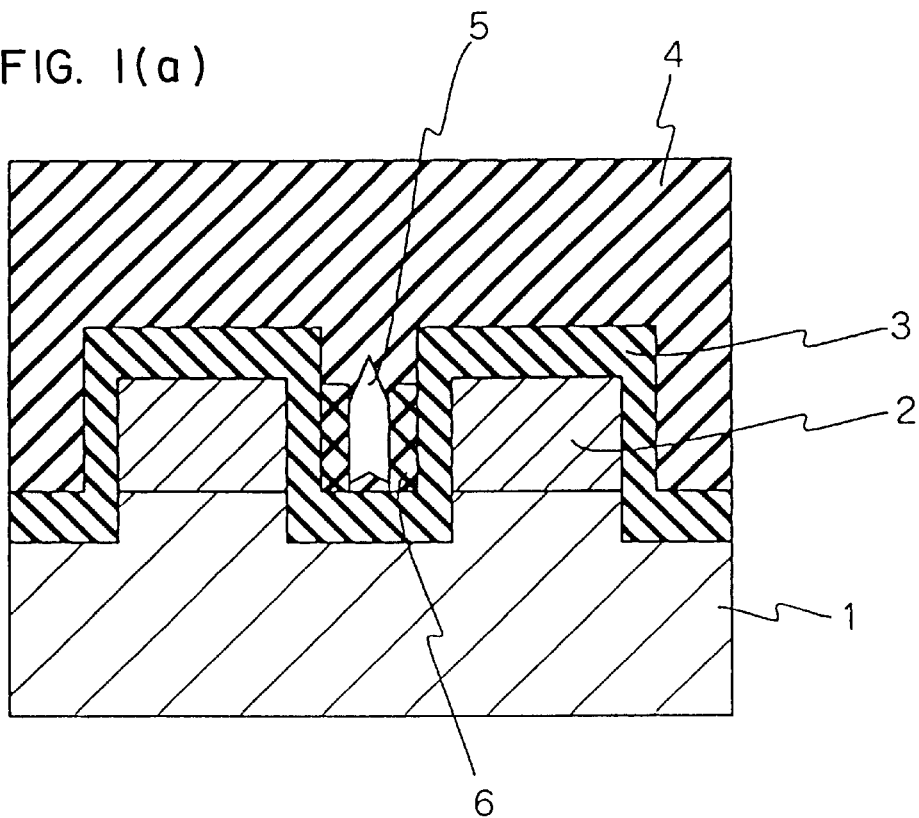

FIGS. 1(a) and (b) are cross-sectional views illustrating the semiconductor device to which an embodiment of the present invention pertains.

In the semiconductor device to which the present embodiment pertains as illustrated in FIG. 1(a), wiring 2 is formed on a semiconductor substrate 1. The surface of this wiring 2 is covered by means of the plasma CVD method with a first insulating film 3. Moreover, the structure is such that a second insulating film 4 containing air gaps 5 is embedded between the wiring 2 covered with the first insulating film 3. In forming the second insulating film 4, the bias CVD, high-density plasma CVD or similar methods are employed.

In this embodiment of the present invention, the surface of the wiring 2 is covered with the first insulating film 3. This means that even if in the formation of the second insulating film 4 containing air gaps 5 a low-density inferior insulating film 6 is formed, it is possible to ensure satisfactory insulating properties thanks to the first insulating film 3.

Figure 1B:
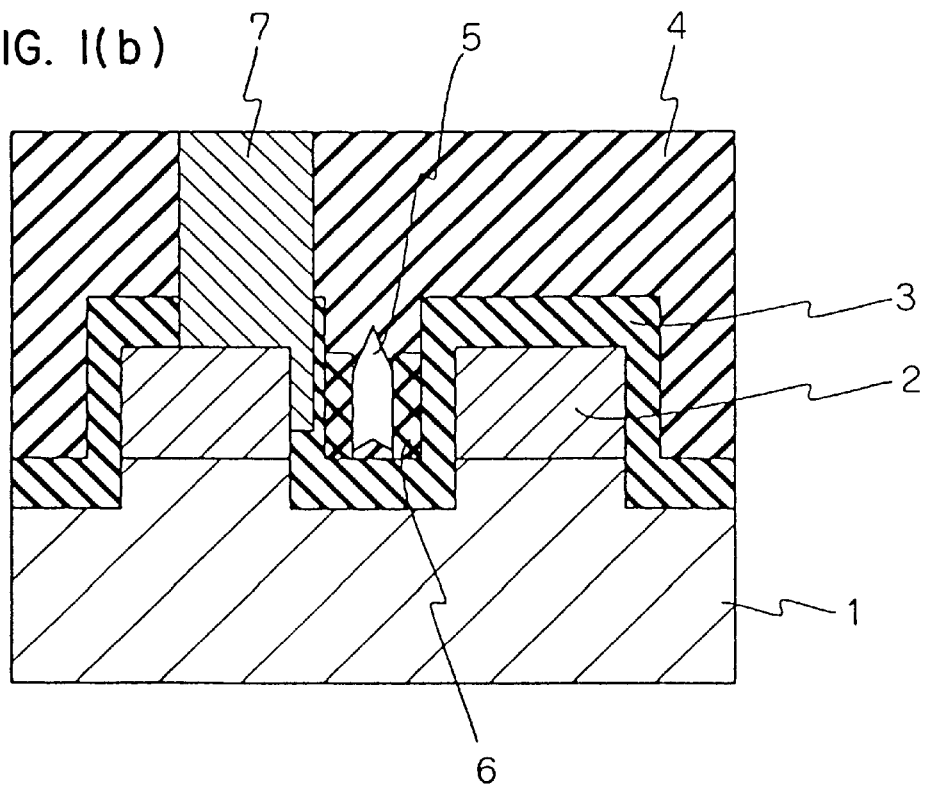

In the semiconductor device to which the present embodiment pertains as illustrated in FIG. 1(b), the wiring 2 is provided with a via 7, and the surface of the wiring 2 is covered with the first insulating film 3. This means that there is no problem even if mask slipping occurs during the lithography process while the via 7 is being fitted on the wiring 2. In other words, as will be clear from FIG. 1(b), adequate insulation is guaranteed by the first insulating film 3 even if the via slips a little from the wiring 2. This makes it possible to form wiring with a high degree of reliability.

Embodiment 2

FIGS. 2 and 3 will be used to explain a method whereby the semiconductor device illustrated in FIG. 1 is manufactured.

Figure 2A:
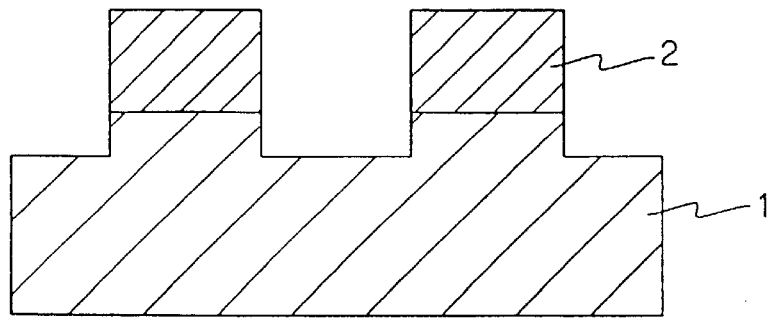
FIGS. 2(a), 2(b) and 2(c) are cross-sectional views illustrating the order of manufacturing processes in the semiconductor device to which an embodiment of the present invention pertains.

To begin with, as FIG. 2(a) shows, a thin metal film is formed on the semiconductor substrate 1 by means of the sputtering method. This is etched selectively to form the wiring 2.

Figure 2B:
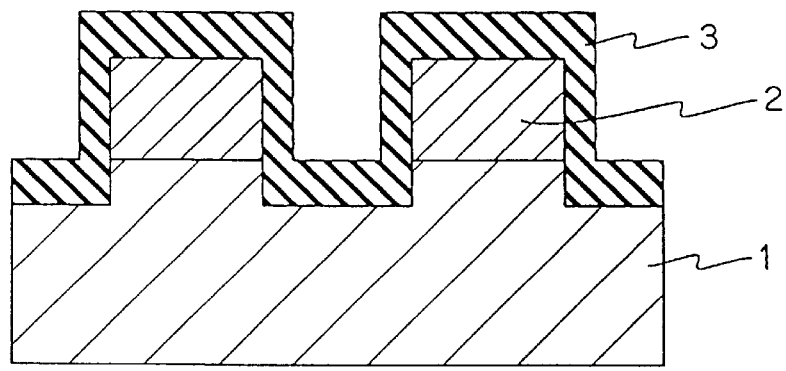

Next, as FIG. 2(b) shows, the first insulating film 3 is formed on the wiring 2 by means of the plasma CVD method to a thickness of 1000 Å. In this manner a high-density oxide film is formed on the side walls of the wiring 2. Needless to say, the most suitable film thickness may be selected in accordance with various conditions, such as the interval between the wiring which is formed or the degree of accuracy of mask slipping during formation of the via 7.

Figure 2C:
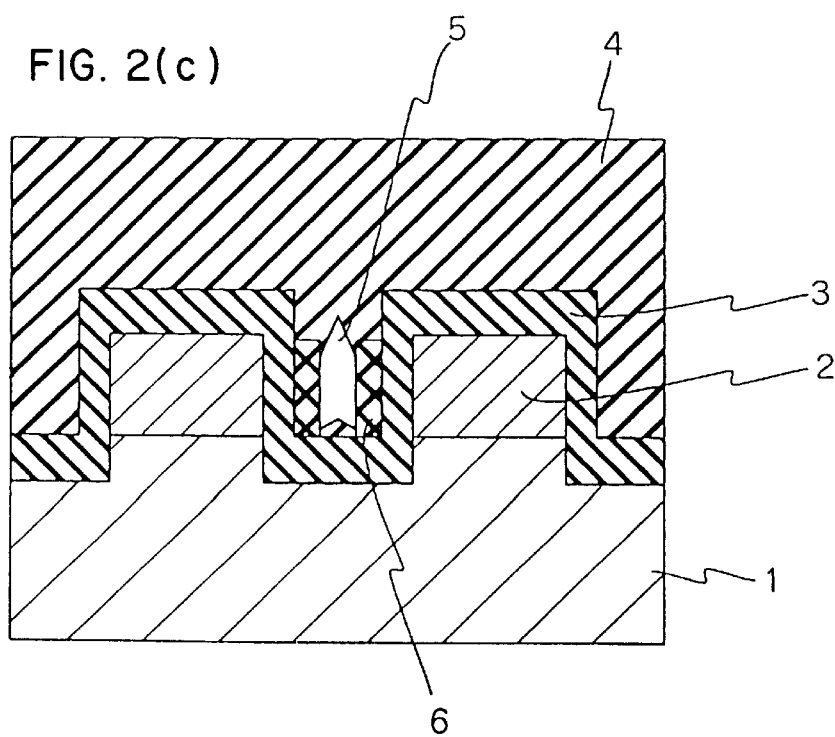

Then, as FIG. 2(c) shows, the bias CVD method is employed to form the second insulating film 4 containing air gaps 5, and this is embedded between the wiring 2. After that, the second insulating film 4 is flattened by means of the CMP method.

Figure 3A:
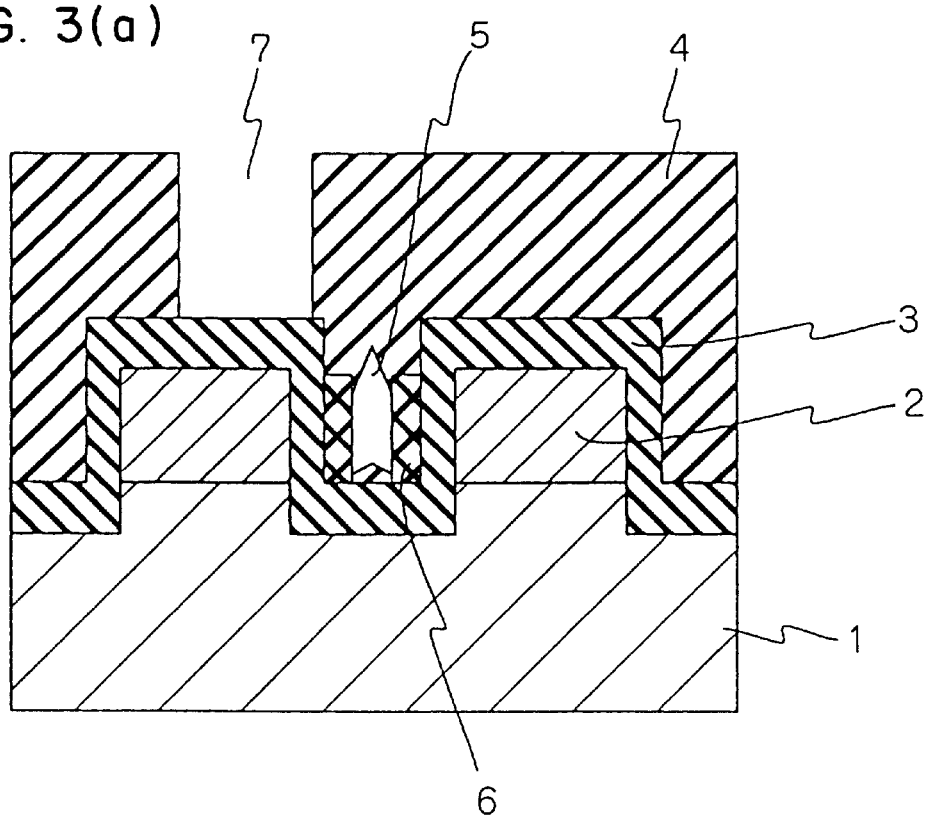
FIGS. 3(a and 3(b) are cross-sectional views illustrating the order of manufacturing processes in the semiconductor device to which an embodiment of the present invention pertains, and in particular the formation of the via.

Next, as FIG. 3(a) shows, a via 7 to the wiring 2 is opened selectively in the second insulating film 4.

Figure 3B:
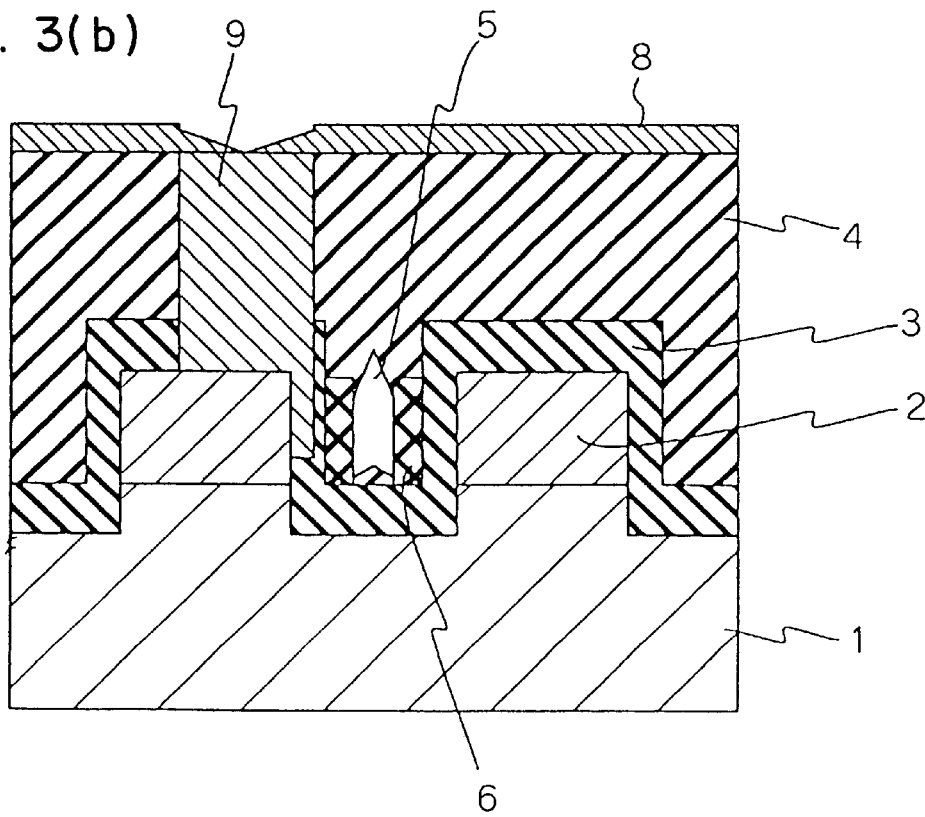

Then, as FIG. 3(b) shows, the sputtering method is employed in order to form a TiN barrier layer 8 with a thickness of 500 Å, after which a tungsten plug 9 is formed within the via 7 by means of the blanket CVD and dry etch-back methods. And TiN barrier layer 8 is also form within the via 7.

Adopting the means outlined above allows insulation to be maintained thanks to the formation of the first insulating film 3 even where the via 7 deviates from the centre of the wiring 2. As a result, the plug 9 can be formed with a high yield.

It goes without saying that in FIG. 3(b) the plug 9 can be formed with a high yield by means of the selective CVD method even without forming a barrier layer 8.

Moreover, in the process whereby the second insulating film 4 is formed, it is also possible to employ the sputtering method (especially the bias sputtering method) or the plasma CVD method to form the second insulating film 4 with the desired air gaps.

Next, FIG. 4 will be used to explain a method whereby a semiconductor device is manufactured in order to implement the wiring structure illustrated in FIG. 1.

Figure 4A:
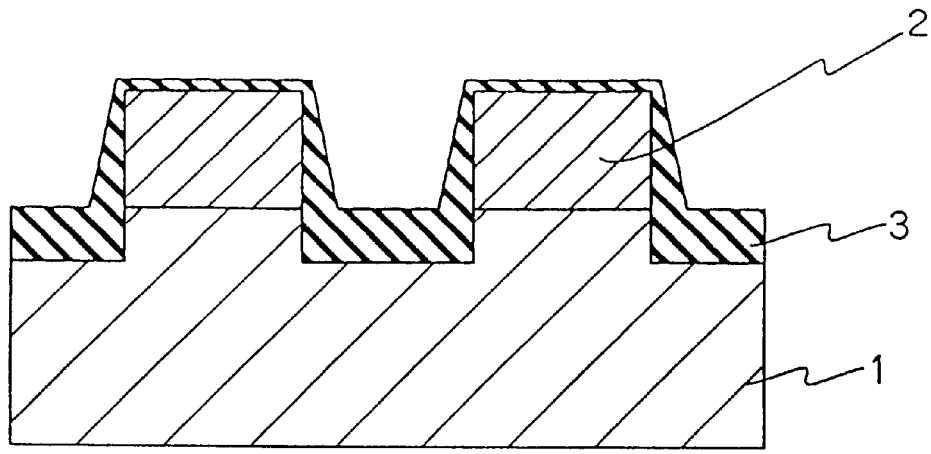
FIGS. 4(a) and 4(b) are cross-sectional views illustrating the order of manufacturing processes in the semiconductor device to which an embodiment of the present invention pertains.

To begin with, as FIG. 4(a) shows, the wiring 2 is formed selectively on the semiconductor substrate 1. On the surface of this is formed the first insulating film 3 as an inorganic coating by means of spin coating method and heat treatment to a thickness of 2000 Å. The heat treatment temperature varies according to the type of inorganic material, but is in the region of 400° C. In this manner a high-density insulating film 3 is formed on the side walls of the wiring 2.

Figure 4B:
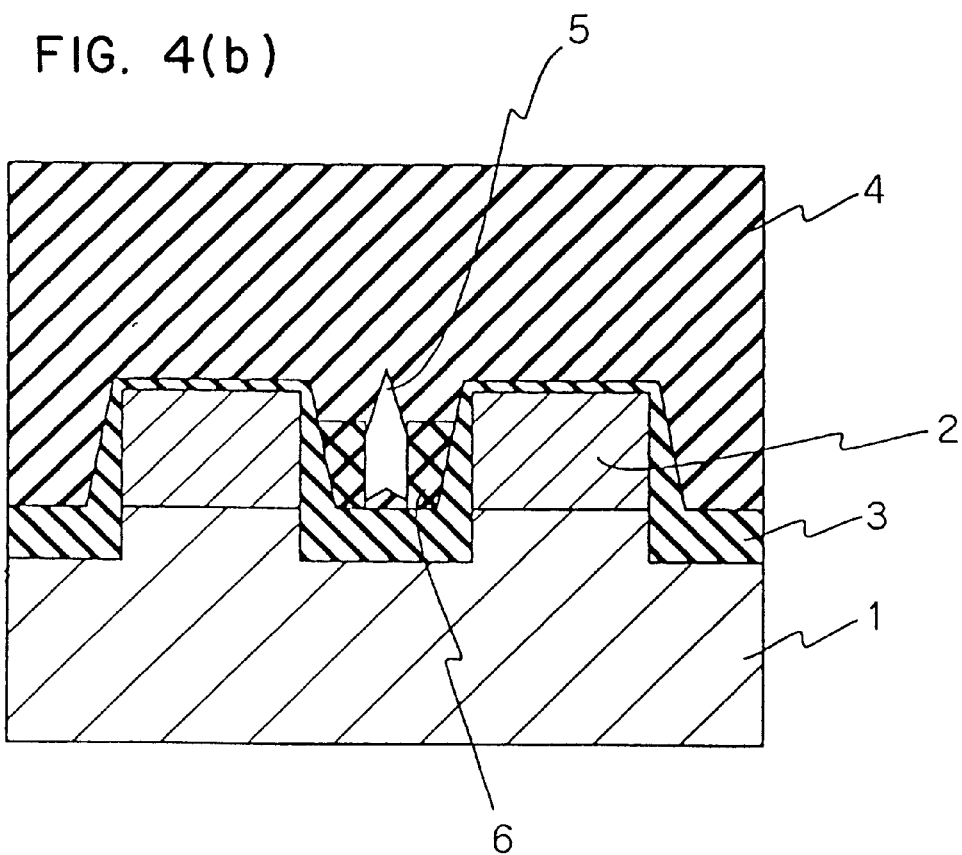
Figure 5:
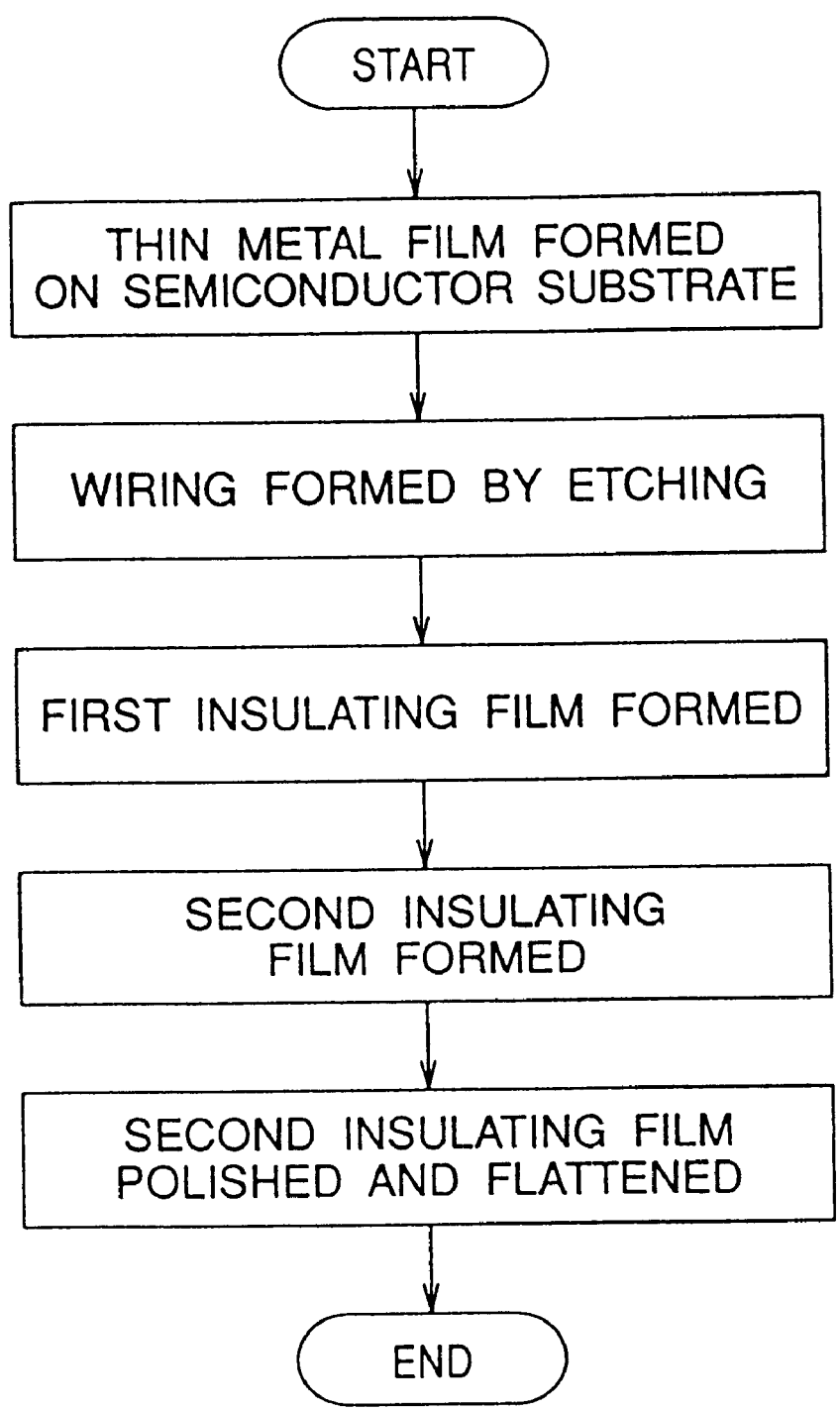
FIG. 5 is a flowchart illustrating the method of manufacturing semiconductor devices to which the present invention pertains.
Figure 6A:
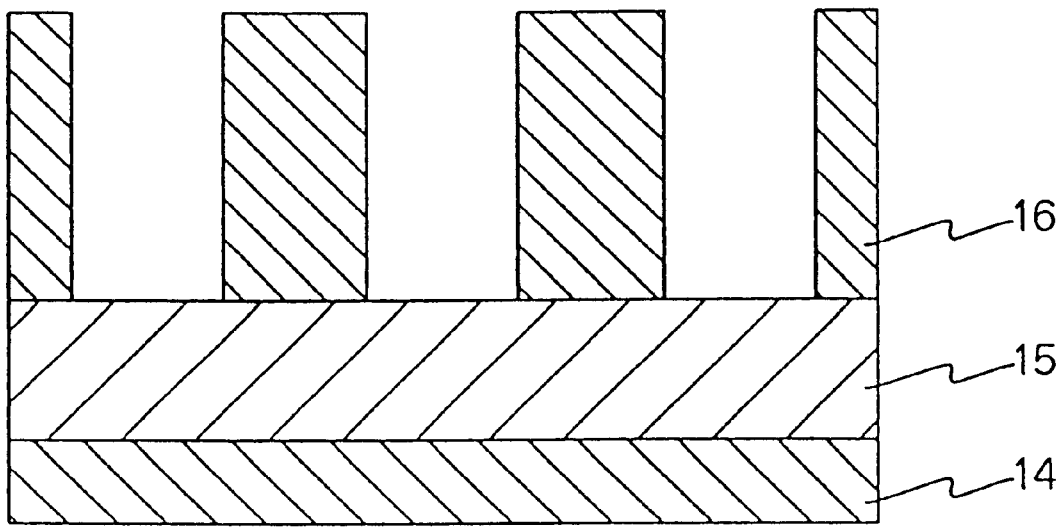
FIGS. 6(a) and 6(b) are cross-sectional views illustrating a conventional semiconductor device.
Figure 6B:
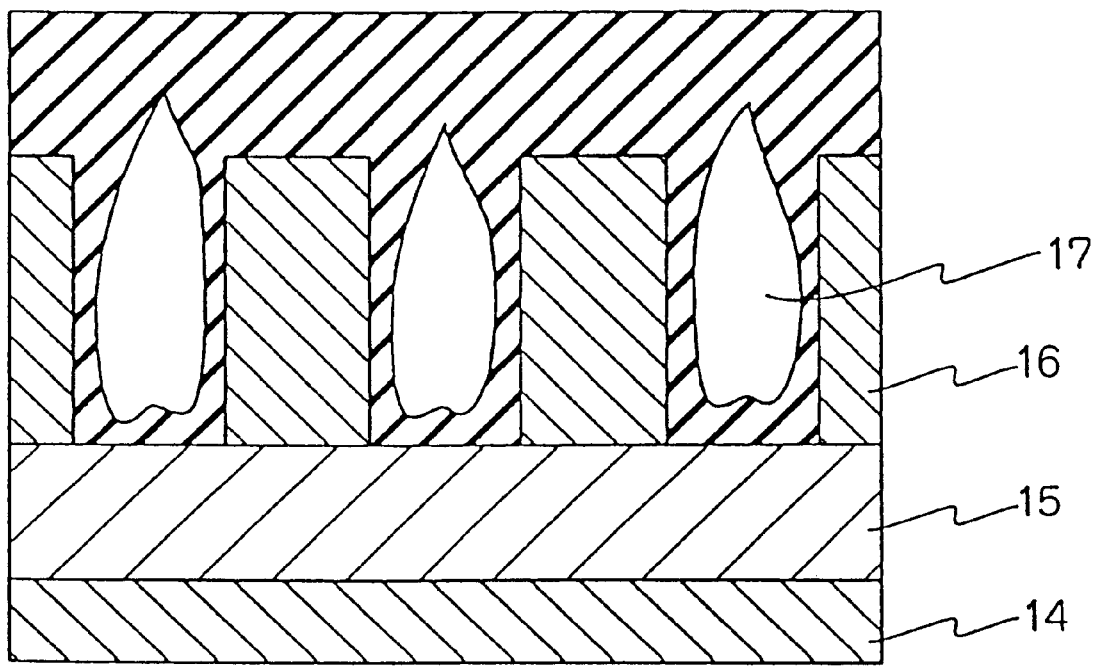
Figure 7A:
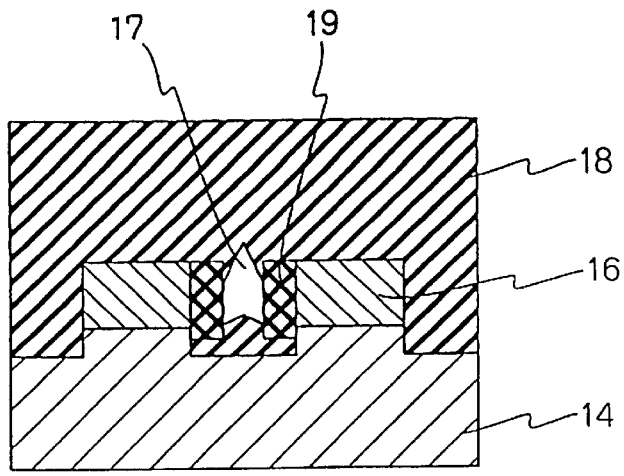
FIGS. 7(a), 7(b) and 7(c) are cross-sectional views illustrating the problem with a conventional semiconductor device.
Figure 7B:
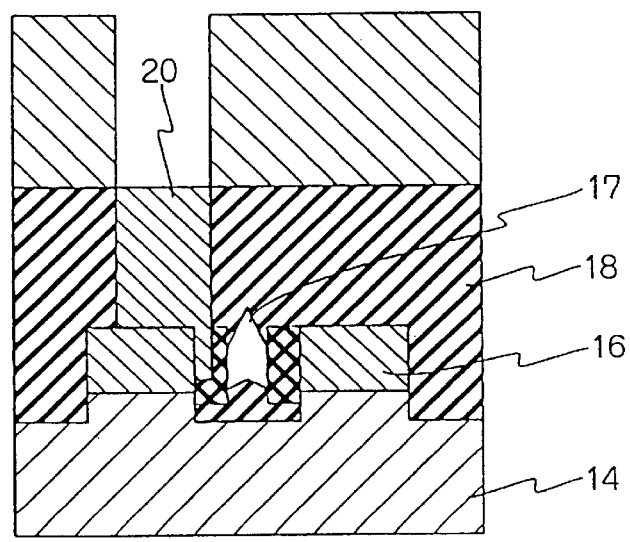
Figure 7C:
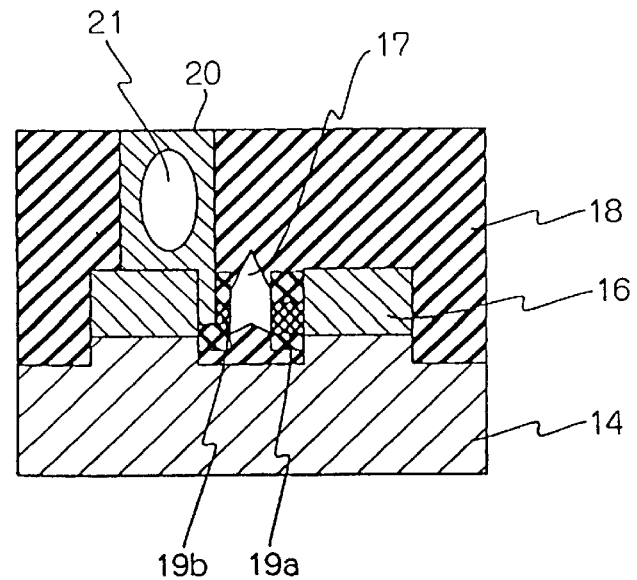

Next, as FIG. 4(b) shows, the bias CVD method is employed to form the second insulating film 4 containing air gaps 5. After that, the same method as that outlined in Embodiment 2 is adopted to produce a stable wiring structure. FIG. 5 is a flowchart illustrating the method of manufacturing semiconductor devices to which the present invention pertains.

As has been explained above, because the surface of the wiring is covered with an insulating film, the present invention allows adequate insulation to be maintained on subsequent formation of the second insulating film containing air gaps, even if a coarse insulating film is formed.

Moreover, since it is possible to absorb any deviation between the wiring and the via caused by mask slipping in the lithography process when the insulating film containing the air gaps is formed, it allows the margin of mask slipping to be increased. This means that it is possible to improve the electric reliability of the wiring including the via.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-164467 (Filed on Jun. 20, 1996) including specification, claims, drawings and summary are incorporated herein by reference in its entirety.

What is claimed is:

1. A method of manufacturing a semiconductor device, comprising the steps of:

forming a first insulating film that covers the surface and sidewalls of adjacent wiring formed on a semiconductor substrate, to a thickness greater than or equal to 1000 Å; and forming a second insulating film on the first insulating film, wherein the second insulating film has at least one air gap completely enclosed therein and positioned between the adjacent wiring.

2. The method of manufacturing a semiconductor device according to claim 1, wherein the first insulating film is formed by a plasma CVD method.

3. The method of manufacturing a semiconductor device according to claim 1, wherein the first insulating film is formed by a spin coating method.

4. The method of manufacturing a semiconductor device according to claim 1, wherein the second insulating film is formed by a bias CVD method.

5. The method of manufacturing a semiconductor device according to claim 1, wherein the first insulating film is formed by a plasma CVD method.

6. The method of manufacturing a semiconductor device according to claim 1, wherein the first insulating film is formed by a sputtering method.

7. The method of manufacturing a semiconductor device according to claim 1, wherein the first insulating film is formed by a spin coating method.

8. The method of manufacturing a semiconductor device according to claim 1, further comprising the steps of:

forming a thin metal film on the semiconductor substrate by a sputtering method; and forming a plurality of wiring, including the adjacent wiring, by selectively etching the thin metal film, wherein the first insulating film is formed by a plasma CVD method so as to cover the surface of the plurality of wiring; and wherein the second insulating film is formed by a bias CVD method and a mirror surface of the second insulating film is polished in order to flatten it.

9. The method of manufacturing a semiconductor device according to claim 1, further comprising the steps of:

forming a hole through the first and second insulating films to expose an upper surface of one of the adjacent wiring, wherein the hole exposes a sidewall of said one of the adjacent wiring; and filling the hole completely with metal to form a contact with no cavities therein.

10. A method of manufacturing a semiconductor device, comprising the steps of:

forming a plurality of wiring elements on a semiconductor substrate;

forming a first insulating film to a thickness greater than or equal to 1000 Å to cover the surface and sidewalls of the wiring elements and exposed surfaces of the semiconductor substrate;

forming a second insulating film above the first insulating film, wherein the second insulating film has an air gap enclosed entirely therein between adjacent wiring elements;

forming a hole through the first and second insulating films to expose one of (1) an upper surface of one of the adjacent wiring elements and (2) an upper surface of one of the adjacent wiring elements and a sidewall thereof; and filling the hole completely with metal to form a cavity-free contact, said cavity-free contact formed even when said one of the adjacent wiring elements has an exposed sidewall.

* * * * *